US010916576B2

(12) United States Patent
Kyung et al.

(10) Patent No.: US 10,916,576 B2
(45) Date of Patent: Feb. 9, 2021

(54) MULTI PIXEL MICRO LENS PIXEL ARRAY AND CAMERA SYSTEM FOR SOLVING COLOR MIX AND OPERATING METHOD THEREOF

(71) Applicant: CENTER FOR INTEGRATED SMART SENSORS FOUNDATION, Daejeon (KR)

(72) Inventors: Chong Min Kyung, Daejeon (KR); Seung Hyuk Chang, Daejeon (KR); Won Seok Choi, Daejeon (KR)

(73) Assignee: CENTER FOR INTEGRATED SMART SENSORS FOUNDATION, Daejeon (KR)

( * ) Notice: Subject to any disclaimer, the term of this patent is extended or adjusted under 35 U.S.C. 154(b) by 76 days.

(21) Appl. No.: 16/403,405

(22) Filed: May 3, 2019

(65) Prior Publication Data
US 2019/0348454 A1 Nov. 14, 2019

(30) Foreign Application Priority Data

May 8, 2018 (KR) ........................ 10-2018-0052233

(51) Int. Cl.
| | |
|---|---|
| *H04N 5/225* | (2006.01) |
| *H01L 27/146* | (2006.01) |
| *H04N 5/341* | (2011.01) |
| *H04N 5/232* | (2006.01) |

(52) U.S. Cl.
CPC .. *H01L 27/14623* (2013.01); *H01L 27/14605* (2013.01); *H04N 5/2253* (2013.01); *H04N 5/2254* (2013.01); *H04N 5/23229* (2013.01); *H04N 5/341* (2013.01)

(58) Field of Classification Search
CPC ........ H01L 27/14623; H01L 27/14605; H01L 27/14621; H01L 27/14645; H01L 27/14627; H04N 5/2253; H04N 5/2254; H04N 5/23229; H04N 5/2226; H04N 5/341; H04N 9/07; H04N 9/04555
USPC ........................................................ 257/432
See application file for complete search history.

(56) References Cited

U.S. PATENT DOCUMENTS

| | | | | |
|---|---|---|---|---|
| 2008/0106629 A1* | 5/2008 | Kurtz | ..................... | H04N 7/144 348/333.01 |
| 2008/0303919 A1* | 12/2008 | Egawa | ............... | H04N 9/04559 348/223.1 |
| 2011/0279727 A1* | 11/2011 | Kusaka | ............. | H01L 27/14605 348/340 |

(Continued)

*Primary Examiner* — Hrayr A Sayadian
(74) *Attorney, Agent, or Firm* — BakerHostetler

(57) ABSTRACT

A camera system includes a single lens and an image sensor including a reference pixel array including a plurality of W (white) pixels in a two-dimensional arrangement and a single microlens formed on the plurality of W pixels to be shared, and at least one color pixel array including two W pixels and two color pixels in a two-dimensional arrangement, and a single microlens disposed on the two W pixels and the two color pixels to be shared. Light shielding layers formed with Offset Pixel Apertures (OPAs) are disposed on the plurality of W pixels included in the reference pixel array and the two W pixels included in the at least one color pixel array, respectively, and the OPAs are formed on the light shielding layers in the reference pixel array and the at least one color pixel array, respectively, to maximize a spaced distance between the OPAs.

9 Claims, 10 Drawing Sheets

(56) References Cited

U.S. PATENT DOCUMENTS

2015/0304582 A1* 10/2015 Hirota .................... H04N 5/332
348/49
2020/0284883 A1* 9/2020 Ferreira ................ G01S 7/4816

* cited by examiner

MULTI PIXEL MICRO LENS PIXEL ARRAY AND CAMERA SYSTEM FOR SOLVING COLOR MIX AND OPERATING METHOD THEREOF

CROSS-REFERENCE TO RELATED APPLICATIONS

A claim for priority under 35 U.S.C. § 119 is made to Korean Patent Application No. 10-2018-0052233 filed on May 8, 2018, in the Korean Intellectual Property Office, the entire contents of which are hereby incorporated by reference.

BACKGROUND

Embodiments of the inventive concept described herein relate to a camera system having a structure with an increased baseline for solving color mix in which a color optical signal and a W optical signal are contaminated with each other at pixels of an image sensor.

A method of calculating a depth for a subject which is referred to as a distance between a camera system (more precisely, an image sensor included in the camera system) and the subject includes a method using a blur change between images obtained through a plurality of apertures of the camera system and a method using a disparity.

In detail, the conventional method using the disparity includes configuring a stereo camera system including two lenses and an image sensor, respectively processing an optical signal introduced through the two lenses to obtain two images having the disparity or processing an optical signal passing through each of a plurality of apertures (offset aperture; OA) formed on a single lens in a single camera system to obtain two images having the disparity, and calculating the depth for the subject based on the disparity of the two images through a formula.

However, because the conventional method using the disparity configures one camera system with the two lenses, it is difficult to miniaturize the camera system due to a wide cross-sectional area. The conventional method using the disparity through the OA lowers a range of the calculated depth because a length of a baseline of the camera system is short to reduce the disparity between the images.

Thus, embodiments below provide a camera system having a structure capable of solving disadvantages of the conventional method using the disparity.

In particular, following embodiments provide a camera system capable of solving the color mixing problem which is caused by the structure overcoming the method of using the disparity.

SUMMARY

Embodiments of the inventive concept provide a technique for solving color mix problem which occurs in a camera system having a structure with an increased baseline to overcome the disadvantage that it is difficult to miniaturize due to a wide cross-sectional area of a stereo camera system or that a range of depth is small due to a small disparity between images in an OA-based camera system.

In detail, an embodiment provides a camera system having one of a first structure including a reference pixel array or a second structure including at least one pixel array implemented with only a plurality of W pixels to solve color mix problem which occurs in the camera system where Offset Pixel Apertures (OPAs) are applied to pixels included in an image sensor and a spaced distance between the OPAs is maximized.

In addition, an embodiment provides an operation method of compensating color mix in the camera system having the first structure.

According to an exemplary embodiment, a camera system includes a single lens, and an image sensor including a reference pixel array including a plurality of W (white) pixels in a two-dimensional arrangement and a single microlens formed on the plurality of W pixels to be shared and at least one color pixel array including two W pixels and two color pixels in a two-dimensional arrangement, and a single microlens disposed on the two W pixels and the two color pixels to be shared. Light shielding layers formed with Offset Pixel Apertures (OPAs) may be disposed on the plurality of W pixels included in the reference pixel array and the two W pixels included in the at least one color pixel array, respectively, and the OPAs may be formed on the light shielding layers in the reference pixel array and the at least one color pixel array, respectively, to maximize a spaced distance between the OPAs.

According to an aspect, the camera system may further include at least one processor that calculates an uncontaminated color optical signal received at the at least one color pixel array using an uncontaminated W optical signal received at the reference pixel array.

According to another aspect, the at least one processor may calculate a depth for a subject using a disparity between any at least two images of any one set which is obtained through the plurality of W pixels included in the reference pixel array or is obtained through the two W pixels included in the at least one color pixel array.

According to still another aspect, the OPAs may be formed on the light shielding layers, respectively, in the reference pixel array and the at least one color pixel array, in a horizontal direction, in a vertical direction, or in a diagonal direction to maximize the spaced distance between the OPAs, such that a baseline of the camera system is increased.

According to still another aspect, an offset f-number associated with the spaced distance between the OPAs in the reference pixel array and a height of each of the plurality of W pixels included in the reference pixel array and an offset f-number associated with the spaced distance between the OPAs in the at least one color pixel array and a height of each of the two W pixels included in the at least one color pixel array may be larger than an f-number of the single lens.

According to still another aspect, the two color pixels included in the at least one color pixel array may process color optical signals of the same wavelength.

According to still another aspect the OPAs disposed on two W pixels of the plurality of W pixels included in the reference pixel array and the OPAs disposed on the two W pixels included in the at least one color pixel array may have the same center with respect to each pixel.

According to still another aspect, at least two OPAs of the OPAs disposed on the plurality of W pixels included in the reference pixel array may have offset centers which are shifted with respect to each pixel. The OPAs disposed on the two W pixel included in the at least one color pixel array may have offset centers which are shifted with respect to each of the two W pixels.

According to an exemplary embodiment, method of compensating color mix by performing a camera system includes a single lens, and an image sensor including a reference pixel array including a plurality of W (white) pixels in a two-dimensional arrangement and a single microlens formed on the plurality of W pixels to be shared and at least one color pixel array including two W pixels and two color pixels in a two-dimensional arrangement, and a single microlens disposed on the two W pixels and the two color pixels to be shared, wherein light shielding layers formed with Offset Pixel Apertures (OPAs) are disposed on the plurality of W pixels included in the reference pixel array and the two W pixels included in the at least one color pixel array, respectively, and the OPAs are formed on the light shielding layers in the reference pixel array and the at least one color pixel array, respectively, to maximize a spaced distance between the OPAs, includes receiving, by the plurality of w pixels included in the reference pixel array, an uncontaminated w optical signal, receiving, by the two W pixels included in the at least one color pixel array, a contaminated W optical signal, receiving, by the two color pixels included in the at least one color pixel array, a contaminated color optical signal from, and calculating an uncontaminated color optical signal using the uncontaminated W optical signal.

According to an exemplary embodiment, a camera system includes a single lens, and an image sensor including at least one pixel array including a plurality of W pixels in a two-dimensional arrangement and a single microlens disposed on the plurality of W pixels to be shared. Light shielding layers formed with Offset Pixel Apertures (OPAs) may be disposed on at least two W pixels of the plurality of W pixels, and the OPAs may be formed on the light shielding layers, respectively, to maximize a spaced distance between the OPAs.

According to an aspect, the OPAs may be formed on the light shielding layers, respectively, in the at least one pixel array, in a horizontal direction or in a vertical direction to maximize the spaced distance between the OPAs, such that a baseline of the camera system is increased.

According to another aspect, an offset f-number associated with the spaced distance between the OPAs and a height of each of the at least two W pixels may be larger than an f-number of the single lens.

According to still another aspect, the OPAs have offset centers which may be shifted with respect to each pixel.

According to still another aspect, the camera system may further include at least one processor calculating a depth for a subject using a disparity between at least two images obtained from at least two W pixels, on which the OPAs having offset centers are disposed, among the plurality of W pixels.

BRIEF DESCRIPTION OF THE FIGURES

The above and other subjects and features will become apparent from the following description with reference to the following figures, wherein like reference numerals refer to like parts throughout the various figures unless otherwise specified, and wherein.

DETAILED DESCRIPTION

Figure 1:
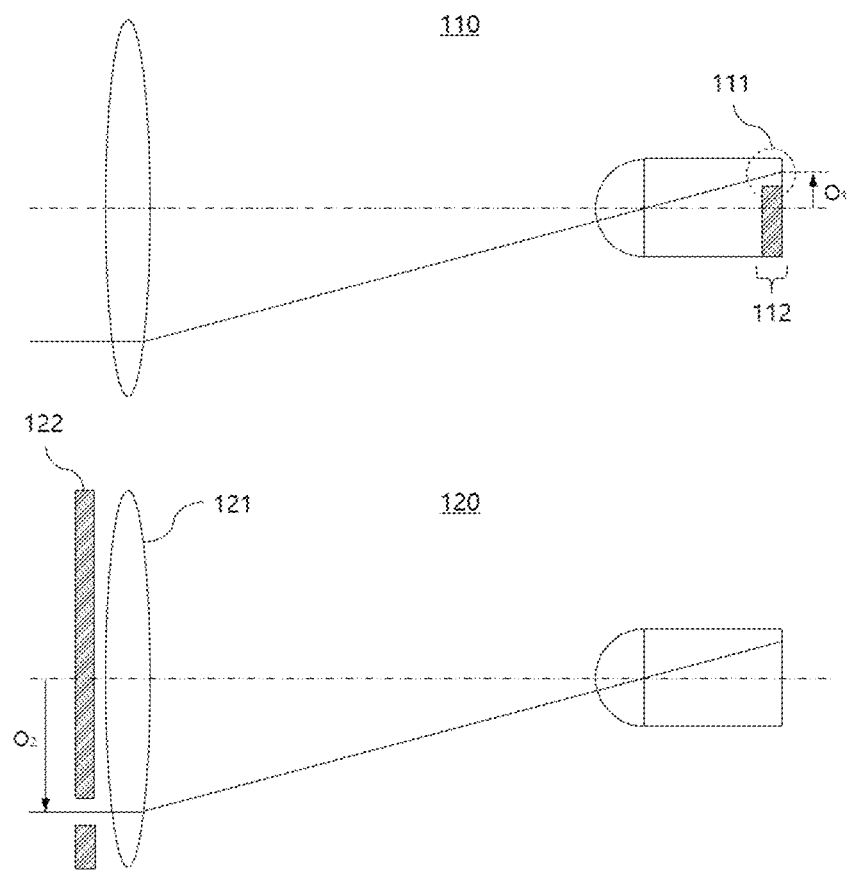
FIG. 1 is a view illustrating a relationship between a camera system with an increased baseline and a camera system with an aperture applied to a single lens.

Hereinafter, embodiments of the inventive concept will be described in detail with reference to the accompanying drawings. However, the inventive concept is not limited to or limited by the embodiments. In addition, the same reference numerals shown in the drawings denote the same members.

Further, terms used in this specification are terms used to appropriately express the preferred embodiment of the inventive concept, and this may vary depending on the audience, the intention of the operator, or the practice of the field to which the present invention belongs. Therefore, the definitions of these terms should be based on the contents throughout this specification. For example, in the present specification, the singular forms include plural forms unless otherwise specified in the specification. It will be further understood that the terms "comprises" and/or "comprising," when used in this specification, specify the presence of stated elements, steps, operations, and/or devices, but do not preclude the presence or addition of one or more other elements, steps, operations, and/or devices.

It should also be understood that the various embodiments of the inventive concept are different, but need not be mutually exclusive. For example, certain features, structures, and characteristics described herein may be implemented in other embodiments without departing from the spirit and scope of the invention in connection with one embodiment. It is also to be understood that the position, arrangement, or configuration of individual components in the respective embodiments may be varied without departing from the spirit and scope of the present invention.

Each depth of pixels included in a two-dimensional image may be calculated to obtain a three-dimensional image with a depth. In this case, the conventional methods of calculating the depth of each of the pixels included in the two-dimensional image include a time of flight (TOF) method in which a laser beam irradiates a subject to be shot and time when the laser beam returns is measured, a depth-from-stereo method in which a depth using a disparity between images respectively obtained from two or more camera systems is calculated, a method (a disparity method using an offset aperture, OA) of calculating the depth using the disparity between images obtained by processing an optical signal passing through each of a plurality of apertures formed in a single lens in a single camera system, and a method (a blur method using a dual aperture, DA) of calculating the depth using a blur change between images obtained by processing the optical signal passing through each of the plurality of apertures formed in the single lens in the single camera system.

Hereinafter, a camera system with an increased baseline is based on the method using the disparity between the images among the conventional methods but an offset pixel aperture (OPA) is applied to pixels of a pixel array included in the image sensor instead of forming a plurality of apertures at the single lens, and therefore the cross-sectional area is minimalized, thereby miniaturizing the camera system.

In particular, the camera system with the increased baseline allows a spaced distance between the OPAs to be maximized so that the baseline is increased to increase the disparity between the images, thereby improving a range of the depth to be calculated.

Figure 2:
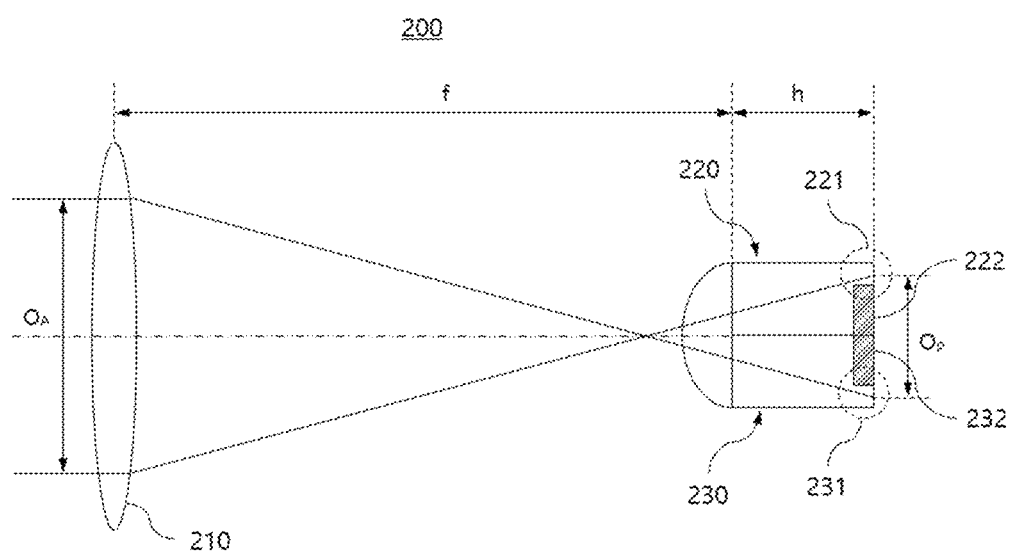
FIG. 2 is a view illustrating a principle of depth calculation in the camera system with the increased baseline.
Figure 3:
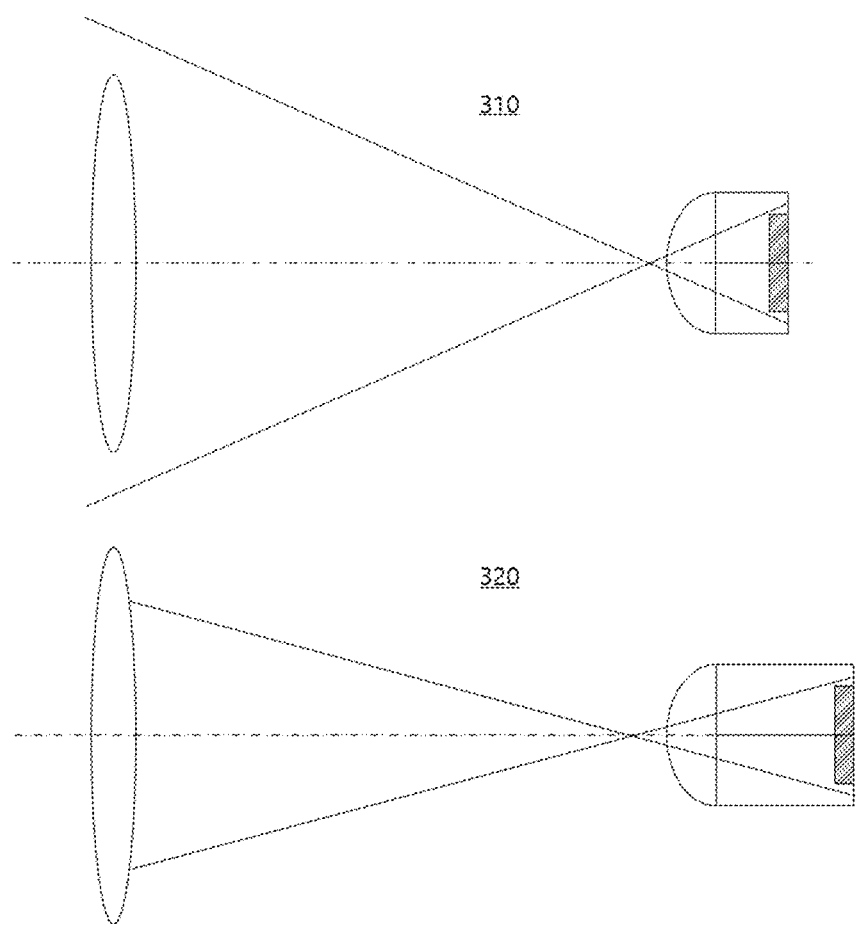
FIG. 3 is a view illustrating limitation of the camera system with the increased baseline.

FIG. 1 is a view illustrating a relationship between a camera system with an increased baseline and a camera system with an aperture applied to a single lens, FIG. 2 is a view illustrating a principle of depth calculation in the camera system with the increased baseline, and FIG. 3 is a view illustrating limitation of the camera system with the increased baseline. Hereinafter, FIG. 1 is described with one pixel to which an OPA is applied in the camera system with the increased baseline, for the sake of convenience of explanation, but the camera system as illustrated in FIG. 2 is based on an image sensor including two pixels to which the OPAs are applied.

Referring to FIG. 1, in a camera system 110 with the increased baseline, a light shielding layer 112 formed with an OPA 111 is disposed at a pixel included in a pixel array of the image sensor. In this case, an offset distance $O_1$ where a center of the OPA 111 is offset from a center of the pixel is proportional to an offset distance $O_2$ where a center of an aperture 122 in the camera system (the conventional camera system) 120 with the aperture 122 formed at a single lens 121 is offset from a center of the single lens 121.

Thus, the OPA 111 having the center shifted from the center of the pixel corresponds to the aperture 122 formed on the single lens 121 to have a center shifted from a center of the single lens 121. Therefore, the camera system 110 with the increased baseline may calculate a depth for a subject using a depth calculation formula with a disparity method using the conventional OA.

More specifically, referring to FIG. 2, in a camera system 200 with the increased baseline, as a diameter $O_A$ of a single lens 210 is proportional to a spaced distance $O_P$ $$\left(O_A \propto \frac{O_P}{h}\right)$$

where the OPAs are spaced apart from each other (more precisely, the spaced distance between a center of a first OPA 221 and a center of a second OPA 231) and a height h of each of the pixels 220 and 230 where light shielding layers 222 and 232 formed with the OPAs 221 and 231 are disposed, the parameter $F_{OA}$ $$\left(F_{OA} \equiv \frac{f}{O_A}\right)$$

associated with the diameter $O_A$ of the single lens 210 and a focal length f is proportional to the height h of each of pixels 220 and 230 and the spaced distance $O_P$ where the OPAs 221 and 231 are spaced apart from each other $$\left(O_A \propto \frac{O_P}{h}\right).$$

Therefore, the camera system 200 with the increased baseline may calculate the depth for the subject using Equation 1 below based on the depth calculation formula of the disparity method using the conventional OA.

$$ds = \frac{f^2(a - a_0)}{a(a_0 - f)F_{OA}} \qquad \langle \text{Equation 1} \rangle$$

In Equation 1, in the image sensor of the camera system 200 with the increased baseline, "ds" refers to the disparity between the images obtained through the two pixels 220 and 230 where the OPAs 221 and 231 are disposed, "f" refers to the focal length, "a" refers to a subject distance (a distance from the subject to a first principal plane of the single lens of the camera system, corresponding to the depth for the subject), "$a_0$" refers to a distance from a subject focused on the image sensor, and "$F_{OA}$" refers to a parameter associated to the diameter $O_A$ of the single lens 210 and the focal length f.

In this case, when the parameter $F_{OA}$ associated to the diameter $O_A$ of the single lens 210 and the focal length f is smaller than an f-number of the single lens included in the camera system 200, as in case of 310 shown in FIG. 3, it is impossible to shoot an image. Hence, $F_{OA}$ should be larger than the f-number of the single lens 210 as in case of 320.

Meanwhile, Equation 2 ("d" refers to a pixel size in Equation 2) representing the disparity for each pixel and being derived from Equation 1 may be expressed as Equation 3 below because the focal length f is proportional to a size of the pixel array configuring the pixels and a Field Of View (FOV)

$$\left(f \propto \frac{\text{sensor size}}{FOV}\right).$$

$$ds/\text{pixel} = \frac{f^2(a - a_0)}{a(a_0 - f)F_{OA}d} \qquad \langle \text{Equation 2} \rangle$$

$$ds/\text{pixel} \propto \frac{(\text{sensor size})^2}{FOV^2 \cdot F_{OA} \cdot (\text{pixel size})} \qquad \langle \text{Equation 3} \rangle$$

Thus, in the camera system 200, $F_{OA}$ is proportional to the spaced distance between the OPAs 221 and 231 and the height of each of the pixels 220 and 230 where the light shielding layers 222 and 232 formed with the OPAs 221 and 231 are disposed $$\left(F_{OA} \propto \frac{\text{pixel height}}{OPA \text{ offset}}\right).$$

Namely, limitation that the above-described $F_{OA}$ should be larger than the f-number of the single lens in case of 320 refers to limitation that an offset f-number $F_{OA}$ associated with the spaced distance between the OPAs 221 and 231 and the height of each of the pixels 220 and 230 to which the OPAs 221 and 231 are applied should be larger than the f-number of the single lens 210. Hereinafter, when the camera system 200 with the increased baseline satisfies the associated limitation, the camera system 200 has a structure in which the spaced distance between the OPAs 221 and 231 is maximized. A detailed description thereof will be described below.

Figure 4:
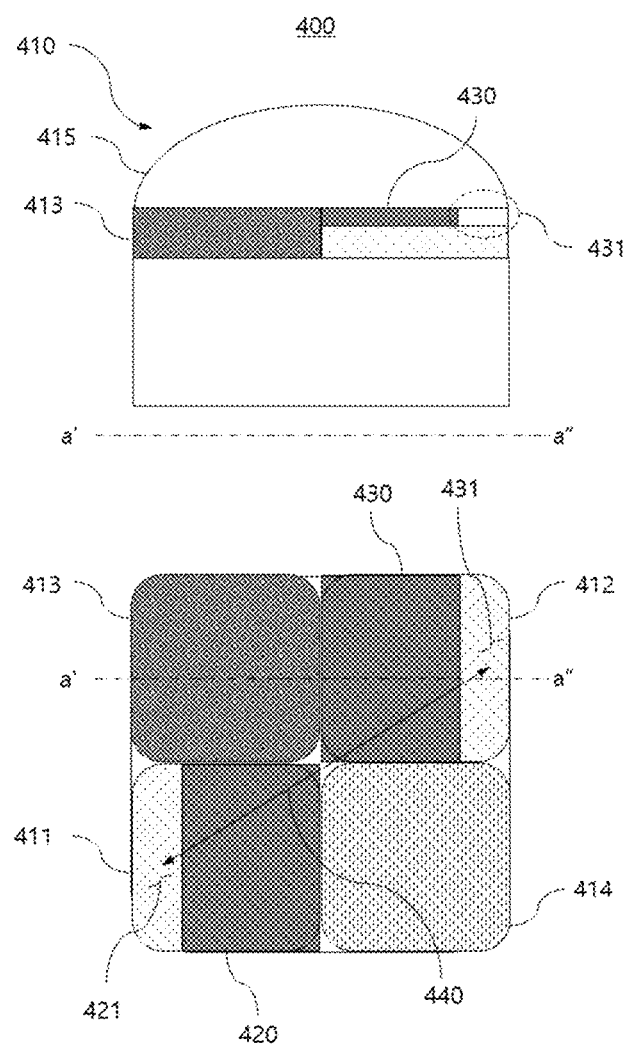
FIG. 4 is a view illustrating a pixel array included in an image sensor of a camera system with an increased baseline.

FIG. 4 is a view illustrating a pixel array included in an image sensor of a camera system with an increased baseline.

Referring to FIG. 4, the camera system with the increased baseline includes a single lens (not shown) and an image sensor 400 and the image sensor 400 includes at least one pixel array 410. Hereinafter, each of the at least one pixel array 410 is a multi-pixel microlens pixel array and includes a plurality of pixels 411, 412, 413, and 414 (e.g., four pixels of a 2×2 arrangement) in a two-dimensional arrangement and a single microlens 415 disposed on the plurality of pixels 411, 412, 413, and 414 so that the plurality of pixels 411, 412, 413, and 414 shares the single microlens 415.

The camera system of the structure with the increased, as described above, where the OPAs are applied to the pixels 411 and 412 as described above, may calculate the depth for the subject based on the disparity between the images obtained through the pixels 411 and 412 similar to the case where the OA is applied to the single lens and may be miniaturized by minimizing a cross-sectional area of the camera system as compared with the case where OA is applied to the single lens. Here, a depth calculation operation may be performed in at least one processor (not shown) further included in the camera system.

In addition, the camera system with the increased baseline allows the plurality of pixels 411, 412, 413, and 414 to share the single microlens 415 so that the baseline may be increased more than when each of the plurality of pixels 411, 412, 413, and 414 is provided with each microlens. In particular, the OPAs are formed and arranged on the pixels 411 and 412 to maximize the spaced distance between the OPAs so that the baseline may be more increased. Thus, the camera system may increase the baseline to allow the disparity between the images to be increased and may improve the range of the depth to be calculated.

The detailed structure of the at least one pixel array 410 of the camera system with the increased baseline will be described below.

Light shielding layers 420 and 430 formed with OPAs 421 and 431 are each disposed on the at least two pixels 411 and 412 of the plurality of pixels 411, 412, 413 and 414 of the at least one pixel array 410. In particular, the OPAs 421 and 431 are formed on the light shielding layers 420 and 430, respectively, to maximize a spaced distance 440 between the OPAs 421 and 431. For example, the OPA 421 of the first pixel 411 and the OPA 431 of the second pixel 412 may be disposed on each of the light shielding layers 420 and 430 and may be respectively formed at a left end of the first pixel 412 and a right end of the second pixel 421 in a diagonal direction, as shown in FIG. 4, thereby maximizing the spaced distance 440.

In addition, for increasing the baseline of the camera system, the at least two pixels 411 and 412 may be disposed on the at least one pixel array 410 to maximize the spaced distance 440 between OPAs 421 and 431 (it means that the at least two pixels 411 and 412 where the light shielding layers 420 and 430 formed with the OPAs 421 and 431 are disposed respectively, are selected among the plurality of pixels 411, 412, 413, and 414 to maximize the spaced distance 440 between the OPAs 421 and 431). For example, the first pixel 411 and the second pixel 412 may be pixels that are arranged diagonally on the pixel array 410 to maximize the spaced distance 440 between the OPAs 421 and 431. Thus, the OPA 421 of the first pixel 411 and the OPA 431 of the second pixel 412 may be arranged in a diagonal direction in the pixel array 410 to maximize the spaced distance 440.

As described above, selection of the at least two pixels 411 and 412 where the light shielding layers 420 and 430 formed with the OPAs 421 and 431 are disposed respectively, among the plurality of pixels 411, 412, 413 and 414 and determination of positions where the OPAs 421 and 431 are respectively formed on the light shielding layers 420 and 430 may be performed to maximize the length of the baseline of the camera system, which satisfies the limitation described above with reference to FIG. 3. For example, when the limitation that the offset f-number $$\left(F_{OA} \propto \frac{\text{pixel height}}{\text{OPA offset}}\right)$$

associated with the spaced distance 440 between the OPAs 421 and 431 and the height of each of the at least two pixels 411 and 421 to which the OPAs 421 and 431 are applied is larger than the f-number of the single lens of the camera system is satisfied, the at least two pixels 411 and 412 where the light shielding layers 420 and 430 are disposed respectively, may be selected among the plurality of pixels 411, 412, 413, and 414 and the positions where the OPAs 421 and 431 are respectively formed on the light shielding layers 420 and 430 may be determined to maximize the spaced distance 440 between the OPAs 421 and 431. Here, with respect to the characteristics of the offset f-number, when the spaced distance 440 between the OPAs 421 and 431 is increased and the height of each of the at least two pixels 411 and 412 to which the OPAs 421 and 431 are applied is also increased proportionally, the size of the offset f-number may be maintained without decreasing. Thus, in the camera system according to an embodiment, the at least two pixels 411 and 412 are disposed on the pixel array 410, respectively, to maximize the spaced distance 440 between the OPAs 421 and 431, the OPAs 421 and 431 are respectively formed on the light shielding layers 420 and 430 to maximize the spaced distances 440, and the height of each of the at least two pixels 411 and 412 to which the OPAs 421 and 431 are applied is increased, thereby satisfying the limitation that the offset f-number is larger than the f-number of the single lens.

In this case, the OPAs 421 and 431 may be formed on the light shielding layers 420 and 430 to have centers shifted from centers of the at least two pixels 411 and 412, respectively. For example, the first OPA 421 has a center shifted to a left side with regard to the center of the first pixel 411, and a second OPA 431 has a center shifted to a right side with regard to the center of the second pixel 412 so that the first OPA 421 and the second OPA 431 may have offset centers, respectively. Thus, there is the disparity between the images obtained through the at least two pixels 411 and 412, and therefore the camera system may calculate the depth for the subject based on the disparity between the images.

As described above, each of the at least two pixels 411 and 412 to which the OPAs 421 and 431 are applied may be a pixel having maximum light transmittance characteristics among the plurality of pixels 411, 412, 413, and 414. For example, as shown in the drawing, the at least two of the pixels 411 and 412 may be W pixels that processes a W (White) optical signal. On the other hand, other pixels 413 and 414 except for the at least two pixels 411 and 412 to which the OPAs 421 and 431 are applied among the plurality of pixels 411, 412, 413 and 414, may be color pixels (e.g., two pixels of R pixels, G pixels, and B pixels) that process color optical signals.

However, a color mix problem may occur in the camera system which includes the image sensor 400 having the structure with the increased baseline as described above. A detailed description thereof will be described with reference to FIG. 5.

Figure 5:
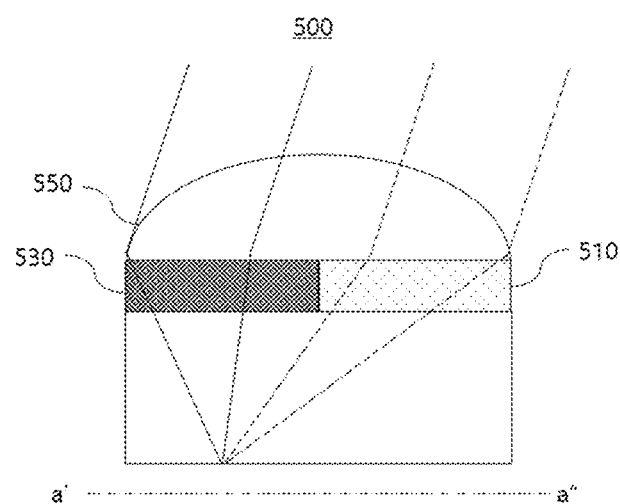
FIG. 5 is a view illustrating a color mix problem which occurs in the camera system with the increased baseline.
Figure 5:
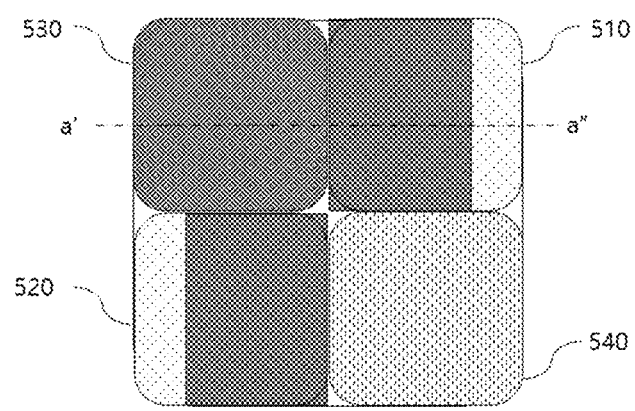

FIG. 5 is a view illustrating a color mix problem which occurs in the camera system with an increased baseline.

Referring to FIG. 5, a pixel array 500 included in an image sensor of the camera system with the increased baseline may include two W pixels 510 and 520 to which OPAs are applied as described above with reference to FIG. 4, and two color pixels 530 and 540 (e.g., an R pixel and a B pixel).

Here, only an R optical signal should be received at the R pixel 530 because the R pixel 530 includes an R color filter (a filter that receives only the R optical signal). Similarly, a B optical signal should be received at the B pixel 540 because the B pixel 540 includes a B color filter (a filter that received only the B optical signal), and a W optical signal should be received at each of the W pixels 510 and 520.

However, the color mix problem in which the W optical signal, the R optical signal, and the B optical signal are mixed to be received is generated because the W pixels 510 and 520, the R pixel 530, and the B pixel 540 are positioned adjacent to one another in the pixel array 500 and share a single microlens 550 to increase the baseline. For example, as shown in the drawing, the R optical signal passing through the color filter of the R pixel 530 and the W optical signal introducing into the W pixel 510 adjacent to the R pixel 530 are simultaneously received at a photodiode of the R pixel 530, so that the color mix problem in which a value of a contaminated optical signal $R_C$ is confirmed and a value of an uncontaminated R optical signal is not confirmed may occur.

Thus, the optical signal $R_C$ received at the R pixel 530, an optical signal $W_{C1}$ received at the first W pixel 510, an optical signal $W_{C2}$ received at the second W pixel 520, and an optical signal $B_C$ received at the B pixel 540 may be expressed as Equation 4 below.

$$R_c = R_u + k_1 W_{u1} + k_2 B_u + k_3 W_{u2}$$

$$W_{c1} = W_{u1} + k_4 R_u + k_5 B_u + k_6 W_{u2}$$

$$B_c = B_u + k_7 R_u + k_8 W_{u1} + k_9 W_{u2}$$

$$W_{c2} = W_{u2} + k_{10} R_u + k_{11} W_{u1} + k_{12} B_u \qquad \text{<Equation 4>}$$

In Equation 4, "$R_C$" refers to a contaminated R optical signal received at the R pixel 530, "$R_U$" refers to an uncontaminated R optical signal received at the R pixel 530, "$W_{U1}$" refers to an uncontaminated W optical signal received at the first W pixel 510, "$B_U$" refers to an uncontaminated B optical signal received at the B pixel 540, and "$W_{U2}$" refers to the uncontaminated W optical signal received at the second W pixel 520. Likewise, "$W_{C1}$" refers to a contaminated W optical signal received at the first W pixel 510, "$B_C$" refers to a contaminated B optical signal received at the B pixel 540, and "$W_{C2}$" refers to the contaminated W optical signal received at the second W pixel 520. "$k_1$" to "$k_{12}$" refer to constant parameters for each of the uncontaminated optical signals.

The constant parameters of $k_1$ to $k_{12}$ should be confirmed to solve the color mix problem because $R_C$, $W_{C1}$, $B_C$, and $W_{C2}$ are received at the pixels 510, 520, 530, and 540 and are confirmed values in the pixel array 500. Hereinafter, a camera system of a first structure for solving the color mix problem by calculating the constant parameters for each of the uncontaminated optical signals and a camera system of a second structure where the color mix problem is not generated will be described below.

Figure 6:
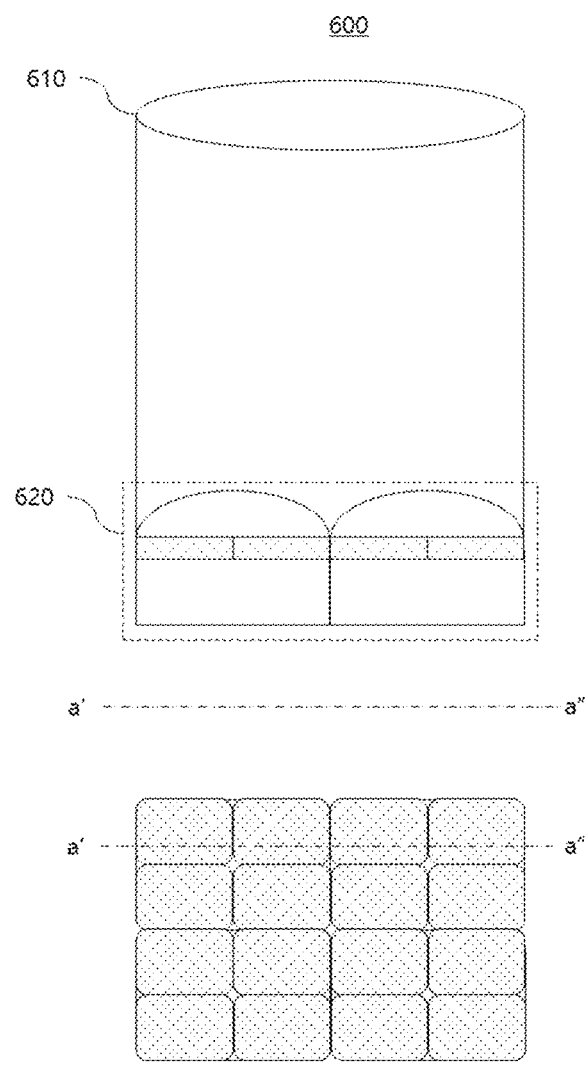
FIG. 6 is view illustrating a camera system according to an embodiment.

FIG. 6 is view illustrating a camera system according to an embodiment.

Referring to FIG. 6, a camera system 600 according to an embodiment includes a single lens 610 and an image sensor 620 disposed at a lower portion of the single lens 610. In this case, the image sensor 620 is configured to include a plurality of pixel arrays and each of the plurality of pixel arrays includes a plurality of pixels (e.g., four pixels of a 2×2 arrangement) and a single microlens which is disposed on the plurality of pixels so that the plurality of pixels shares the single microlens.

When the plurality of pixels share the single microlens and the OPAs are formed and disposed on the pixels to maximize the spaced distance between the OPAs, the camera system 600 according to an embodiment having a structure described above, where the OPAs are applied to the pixels similar to the structure of the camera system with the increased baseline as described above, may calculate a depth for the subject based on the disparity between the images, may be miniaturized by minimizing the cross-sectional area thereof, may increase the baseline to increase the disparity between the images, and may improve a range of the depth to be calculated.

In addition, the camera system 600 may solve the color mix problem generated in the camera system which increases the above-mentioned baseline by applying the first structure or the second structure, which will be described later, to the image sensor.

In the camera system 600 according to an embodiment, the image sensor to which the first structure is applied will be described with reference to FIG. 7 and the image sensor to which the second structure is applied will be described with reference to FIG. 10.

Figure 7:
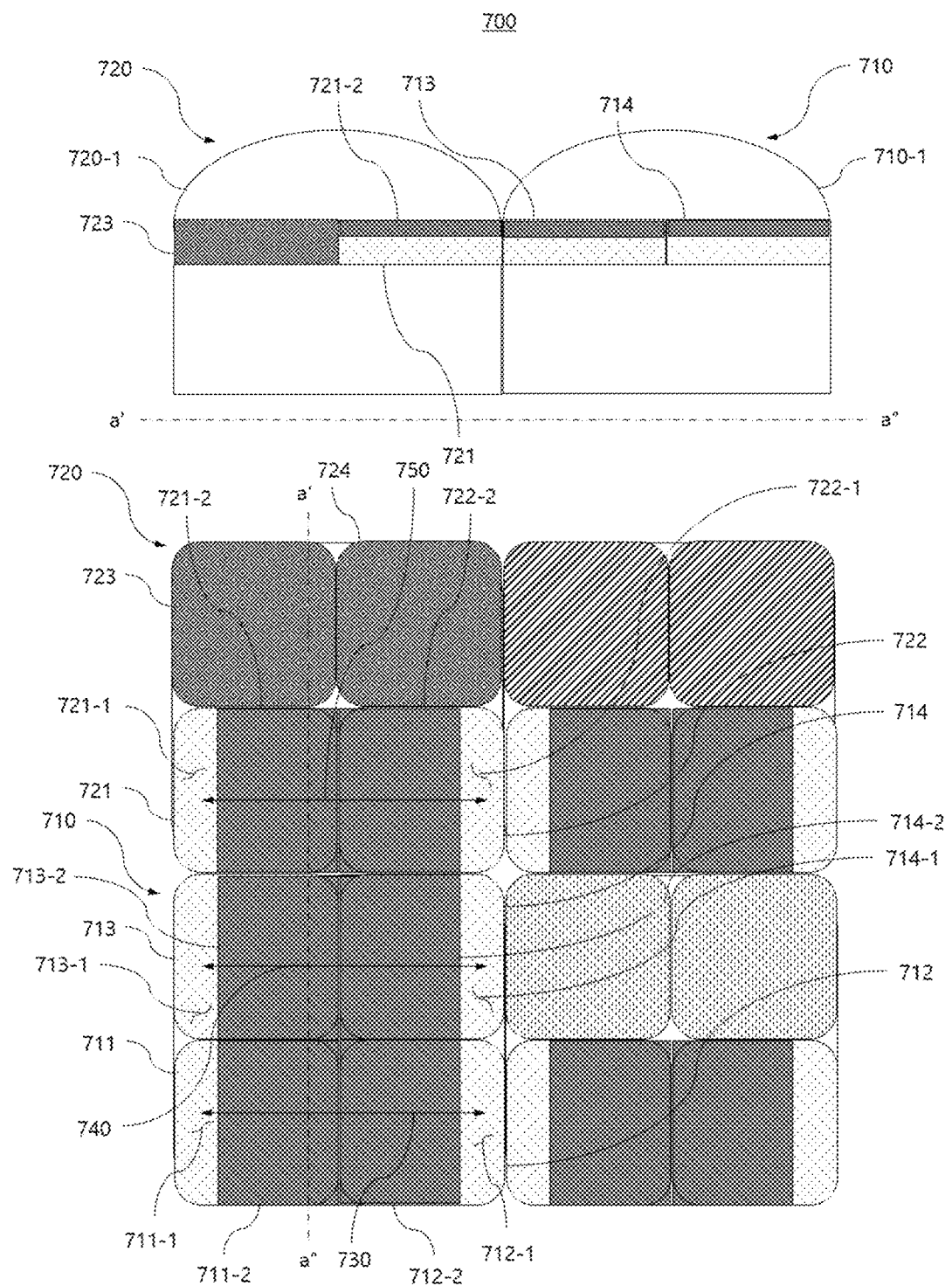
FIG. 7 is a view illustrating an image sensor of a camera system to which a first structure is applied according to an embodiment.
Figure 8:
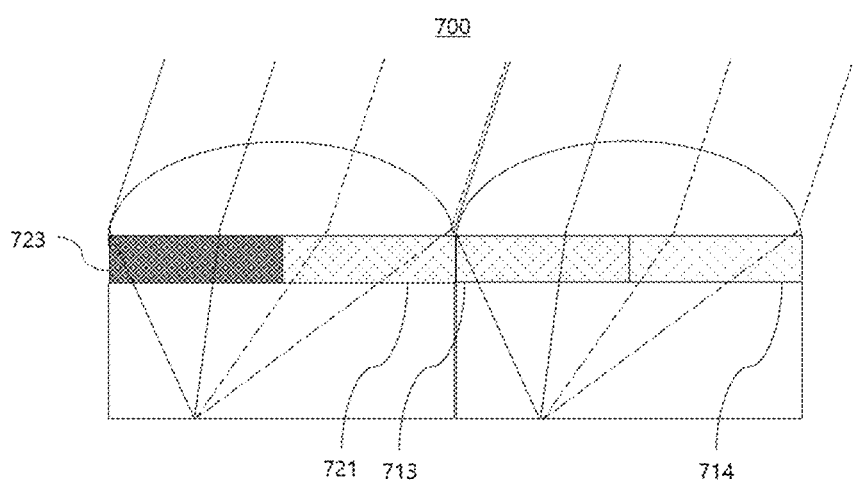
FIG. 8 is a view illustrating a method of compensating a color mix in the image sensor shown in FIG. 7.
Figure 9:
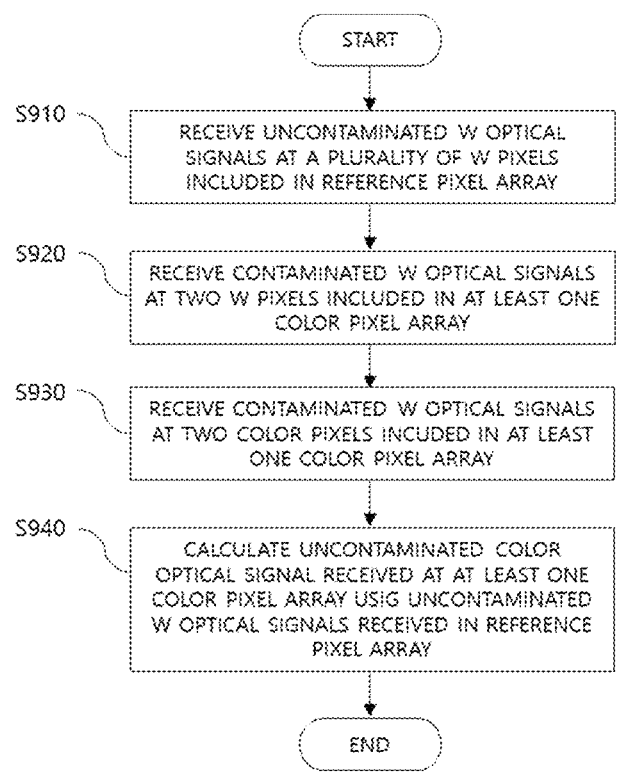
FIG. 9 is a flowchart illustrating a method of compensating for the color mix performed by the camera system to which the first structure is applied, in accordance with an embodiment.

FIG. 7 is a view illustrating an image sensor of a camera system to which a first structure is applied according to an embodiment, FIG. 8 is a view illustrating a method of compensating a color mix in the image sensor shown in FIG. 7, and FIG. 9 is a flowchart illustrating a method of compensating for the color mix performed by the camera system to which the first structure is applied, in accordance with an embodiment.

Referring to FIGS. 7 to 9, an image sensor 700 of the camera system to which the first structure is applied according to an embodiment includes a reference pixel array 710 and at least one color pixel array 720. This image sensor 700 may be included in the camera system 600 described above with reference to FIG. 6 and the camera system to which the first structure is applied may include a single lens and the image sensor 700. Hereinafter, an embodiment will be described as the reference pixel array 710 and the at least one color pixel array 720 each include a plurality of pixels 711, 712, 713, 714, 721, 722, 723, and 724 in a 2×2 arrangement in which the plurality of pixels 711, 712, 713, 714, 721, 722, 723, and 724 share single microlenses 710-1 and 710-2, respectively, but the inventive concept is not limited thereto, and may include a plurality of pixels in various two-dimensional arrangements such as a 3×3 arrangement or a 4×4 arrangement.

The reference pixel array 710 includes a plurality of W pixels 711, 712, 713, and 714 and the single microlens 710-1 arranged on the plurality of W pixels 711, 712, 713, and 714 so that the plurality of W pixels 711, 712, 713, and 714 share the single microlens 710-1. Light shielding layers 711-2, 712-2, 713-2, and 714-2 formed with OPAs 711-1, 712-1, 713-1, and 714-1 are disposed on the plurality of W pixels 711, 712, 713, and 714, respectively. In particular, the OPAs 711-1, 712-1, 713-1, and 714-1 are respectively formed on the light shielding layers 711-2, 712-2, 713-2, and 714-2 in the reference pixel array 710 to maximize a spaced distance 730 therebetween. For example, for increasing the baseline of the camera system (more precisely, for increasing the baseline in the reference pixel array 710), the OPA 711-1 of the first W pixel 711 and the OPA 712-1 of the second W pixel 712 may be formed on each of the light shielding layers 711-2 and 712-2 and may be formed at a left end of the first W pixel 711 and a right end of the second W pixel 712 in a horizontal direction, respectively, as shown in the drawing, to maximize the spaced distance 730 in the horizontal direction. For increasing the baseline of the camera system (more precisely, for increasing the baseline in the reference pixel array 710), the OPA 713-1 of the third W pixel 713 and the OPA 714-1 of the fourth W pixel 714 may be each formed on the light shielding layers 713-2 and 714-2 and may be formed at a left end of the third W pixel 713 and a right end of the fourth W pixel 714 in a horizontal direction, respectively, as shown in the drawing, to maximize a spaced distance 740 in the horizontal direction. However, without being limited thereto, in the reference pixel array 710, when the first W pixel 711 and the third W pixel 713 are adjacent to each other in a vertical direction unlike the drawing, the OPAs 711-1 and 713-1 are each formed on the light shielding layers 711-2 and 713-2 in the vertical direction to maximize the spaced distance between the OPAs 711-1 and 713-1 on the first W pixel 711 and the third W pixel 713, or when the first W pixel 711 and the fourth W pixel 714 are adjacent to each other in a diagonal direction unlike the drawing, the OPAs 711-1 and 714-1 are each formed on the light shielding layers 711-2 and 714-2 in the diagonal direction to maximize the spaced distance between the OPAs 711-1 and 714-1 on the first W pixel 711 and the fourth W pixel 714.

Determination of the positions where the OPAs 711-1, 712-1, 713-1, and 714-1 are formed on the light shielding layers 711-2, 712-2, 713-2, and 714-2, respectively, may be performed to maximize the length of the baseline of the camera system that satisfies the limitation described above with reference to FIG. 3. For example, when the limitation that the of $$\left(F_{OA} \propto \frac{\text{pixel height}}{\text{OPA offset}}\right)$$

associated with the spaced distance 730 between the OPAs 711-1 and 712-1 and the height of each of the first W pixel 711 and the second W pixel 712 to which the OPAs 711-1 and 712-1 are applied is larger than the f-number of the single lens of the camera system is satisfied, the positions where the OPAs 711-1 and 712-1 are formed on the light shielding layers 711-2 and 712-2, respectively may be determined to maximize the spaced distance 730 between the OPAs 711-1 and 712-1. Here, with respect to offset f-number characteristics, when the spaced distance 730 between the OPAs 711-1 and 712-1 is increased and the height of each of the two W pixels 711 and 712 to which the OPAs 711-1 and 712-1 are applied is proportionally increased, the size of the offset f-number may be maintained without decreasing. Thus, the camera system according to one embodiment forms the OPAs 711-1 and 712-1 on the light shielding layers 711-2 and 712-2, respectively, to maximize the spaced distance 730 and the height of each of the two W pixels 711 and 712 to which the OPAs 711-1 and 712-1 are applied is also increased, thereby satisfying the limitation that the offset f-number is larger than the f-number of the single lens.

In this case, the OPAs 711-1 and 712-1 may be formed on the light shielding layers 711-2 and 712-2 to have centers shifted from centers of the pixels 711 and 712, respectively. For example, the first OPA 711-1 has a center shifted to the left with respect to the center of the first W pixel 711, and the second OPA 712-1 has the center shifted to the right with respect to the second W pixel 712 so that the first OPA 711-1 and the second OPA 712-1 may have the offset centers, respectively. Thus, there is the disparity between the images obtained through the two W pixels 711 and 712 so that the camera system may calculate the depth for the subject based on the disparity between the images.

The at least one color pixel array 720 includes two W pixels 721 and 722, two color pixels 723 and 724, and a single microlens 720-1 arranged on the two W pixels 721 and 722 and the two color pixels 723 and 724 so that the two W pixels 721 and 722 and the two color pixels 723 and 724 share the single microlens 720-1. The light shielding layers 721-2 and 722-2 formed with OPAs 721-1 and 722-1 are disposed on the two W pixels 721 and 722, respectively. In particular, the OPAs 721-1 and 722-1 are respectively formed on the light shielding layers 721-2 and 722-2 to maximize a spaced distance 750 therebetween. For example, in the at least one color pixel array 720, for increasing the baseline (more precisely, for increasing the baseline in the at least one color pixel array 720), the OPA 721-1 of the first W pixel 721 and the OPA 722-1 of the second W pixel 722 may be formed on the light shielding layers 721-2 and 722-2, respectively and may be formed at the left end of the first W pixel 721 and the right end of the second W pixel 722 in the horizontal direction, respectively, to maximize the spaced distance 750 in the horizontal direction as shown in the drawing. However, without being limited thereto, in the at least one color pixel array 720, when the first W pixel 721 and the second W pixel 722 are arranged to be adjacent to each other in the vertical direction, the OPAs 721-1 and 722-1 are formed on the light shielding layers 721-2 and 722-2, respectively, to maximize the spaced distance in the vertical direction on the first W pixel 721 and the second W pixel 722 unlike the drawing, or when the first W pixel 721 and the second W pixel 722 are arranged to be adjacent to each other in the diagonal direction, the OPAs 721-1 and 722-1 are formed on the light shielding layers 721-2 and 722-2, respectively, to maximize the spaced distance in the diagonal direction on the first W pixel 721 and the second W pixel 722 unlike the drawing.

Determination of the positions where the OPAs 721-1 and 722-1 are formed on the light shielding layers 721-2 and 722-2, respectively, may be performed to maximize the length of the baseline of the camera system that satisfies the limitation described above with reference to FIG. 3. For example, when the limitation that the offset f-number $$\left(F_{OA} \propto \frac{\text{pixel height}}{\text{OPA offset}}\right)$$

associated with the spaced distance 750 between the OPAs 721-1 and 722-1 and the height of each of the first W pixel 721 and the second W pixel 722 to which the OPAs 721-1 and 722-1 are applied is larger than the f-number of the single lens of the camera system is satisfied, the positions where the OPAs 721-1 and 722-1 are formed on the light shielding layers 721-2 and 722-2, respectively may be determined to maximize the spaced distance 750 between the OPAs 721-1 and 722-1. Here, with respect to offset f-number characteristics, when the spaced distance 750 between the OPAs 721-1 and 722-1 is increased and the height of each of the two W pixels 721 and 722 to which the OPAs 721-1 and 722-1 are applied is proportionally increased, the size of the offset f-number may be maintained without decreasing. Thus, the camera system according to one embodiment forms the OPAs 721-1 and 722-1 on the light shielding layers 721-2 and 722-2, respectively, to maximize the spaced distance 750 and the height of each of the two W pixels 721 and 722 to which the OPA 721-1 and 722-1 are applied is also increased, thereby satisfying the limitation that the offset f-number is larger than the f-number of the single lens.

In this case, the OPAs 721-1 and 722-1 may be formed on the light shielding layers 721-2 and 722-2 to have centers shifted from centers of the pixels 721 and 722, respectively. For example, the first OPA 721-1 has a center shifted to the left with respect to the center of the first W pixel 721, and the second OPA 722-1 has the center shifted to the right with respect to the second W pixel 722 so that the first OPA 721-1 and the second OPA 722-1 may have the offset centers, respectively. Thus, there is the disparity between the images obtained through the two W pixels 721 and 722 so that the camera system may calculate the depth for the subject based on the disparity between the images.

Further, in the image sensor 700, the OPAs 711-1 and 712-1 disposed on the two W pixels 711 and 712 among the plurality of W pixels 711, 712, 713, and 714 included in the reference pixel array 710 and the OPAs 721-1 and 722-1 disposed on the two W pixels 721 and 722 included in the at least one color pixel array 720 may have the same center with respect to each of the pixels 711, 712, 721, and 722. For example, the center of the OPA 711-1 with respect to the first W pixel 711 included in the reference pixel array 710 may be the same as the center of the OPA 721-1 with respect to the first W pixel 721 included in the at least one color pixel array 720. The center of the OPA 712-1 with respect to the second W pixel 712 included in the reference pixel array 710 may be the same as the center of the OPA 722-1 with respect to the second W pixel 722 included in the at least one color pixel array 720.

This is because a method of compensating the color mix, which will be described later, is performed assuming that uncontaminated W optical signals at the two W pixels 721 and 722 included in the at least one color pixel array 720 are the same values as the W optical signal (i.e., an uncontaminated W optical signal because the reference pixel array 710 does not include a color pixel) received at the two W pixels 711 and 712 included in the reference pixel array 710. Namely, in order for the uncontaminated W optical signals received at the two W pixels 721, 722 included in the at least one color pixel array 720 to have the same values as the W optical signals received at the two W pixels 711 and 712 included in the reference pixel array 710, the two W pixels 721 and 722 included in the at least one color pixel array 720 and the two W pixels 711 and 712 included in the reference pixel array 710 should be structurally identical and therefore, the OPAs 711-1 and 712-1 disposed on the two W pixels 711 and 712 among the plurality of W pixels 711, 712, 713, and 714 included in the reference pixel array 710 should have the same centers as the OPAs 721-1 and 722-1 disposed on the two W pixels 721 and 722 included in the at least one color pixel array 720 with respect to each of the pixels 711, 712, 721, and 722.

In addition, the two color pixels 723 and 724 included in the at least one color pixel array 720 may process color optical signals of the same wavelength. For example, the two color pixels 723 and 724 may all be R pixels that receive and process an R optical signal. This is because when the two color pixels 723 and 724 are different pixels (e.g., an R pixel and a G pixel) that process color optical signals of different wavelengths, the uncontaminated R optical signal received at the R pixel and the uncontaminated G optical signal received at the G pixel may not be calculated only using the value of the uncontaminated W optical signal confirmed from the reference pixel array 710.

At least one processor (not shown in FIG. 6) included in the camera system to which the first structure is applied may calculate the uncontaminated color optical signal received at the at least one color pixel array 720 using the uncontaminated W optical signal received at the reference pixel array 710.

More specifically, in S910, the plurality of W pixels 711, 712, 713, and 714 included in the reference pixel array 710 may receive the uncontaminated W optical signals.

Also, in S920, the two W pixels 721 and 722 included in the at least one color pixel array 720 receive the contaminated W optical signals and, in S930, the two color pixels 723 and 724 included in the color pixel array 720 may receive the contaminated color optical signals.

For example, referring to FIG. 8, in some operations (in S910 to S930), each of the first W pixel 711 and the third W pixel 713 included in the reference pixel array 710 may receive the uncontaminated W optical signal as expressed by the following Equation 5.

$$W = W_u \qquad <\text{Equation 5}>$$

In Equation 5, "W" refers to a W optical signal received by each of the first W pixel 711 and the third W pixel 713, and "$W_U$" refers to an uncontaminated W optical signal.

Meanwhile, the first W pixel 721 included in at least one color pixel array 720 may receive the contaminated W optical signal as shown in Equation 6 below, and the R color pixel 723 may receive a contaminated R optical signal as shown in Equation 7 below.

$$W_c = kW_u + (1-k)R_u \qquad <\text{Equation 6}>$$

$$R_c = kR_u + (1-k)W_u \qquad <\text{Equation 7}>$$

In Equations 6 and 7, "$W_C$" refers to a contaminated W optical signal received by the first W pixel 721 included in at least one color pixel array 720, and "$W_U$" refers to an uncontaminated W optical signal, "$R_C$" refers to a contaminated R optical signal received at the R pixel 723 included in at least one color pixel array 720, and "$R_U$" refers to an uncontaminated R optical signal. In Equation 6, "k" and "1−k" refer to constant parameters for the uncontaminated W optical signal and the uncontaminated R optical signal with respect to the first W pixel 721 included in the at least one color pixel array 720. In Equation 7, k and 1−k refer to constant parameters for the uncontaminated R optical signal and the uncontaminated W optical signal with respect to the R pixel 723 included in the at least one color pixel array 720.

Thus, Equation 8 for k may be derived from Equations 5 to 7.

$$k = \frac{W_u - R_c}{2W_u - W_c - R_c} \quad \langle\text{Equation 8}\rangle$$

As the uncontaminated W optical signals received by the first W pixel 711 and the third W pixel 713, respectively, included in the reference pixel array 710, the contaminated W optical signal received by the first W pixel 721 included in the at least one color pixel array 720, and the contaminated R optical signal received by the R pixel 723 included in the at least one color pixel array 720 are identified values, the value of k may be calculated from Equation 8.

Thus, in S940, the at least one processor may calculate the uncontaminated color optical signal received in the at least one color pixel array 720 using the uncontaminated W optical signals received at the reference pixel array 710. Namely, as described above, as the value of k is calculated as shown in Equation 8, based on the uncontaminated W optical signals received at the reference pixel array 710, the at least one processor may calculate the uncontaminated R optical signal from Equation 7 and the k value calculated.

The camera system including the image sensor 700 to which the first structure is applied as described above may calculate the uncontaminated color optical signal received at the at least one color pixel array 720 using the uncontaminated W optical signals received at the reference pixel array 710 to solve the color mix problem which occurs in a camera system having the structure with the increased baseline.

Meanwhile, as the camera system according to one embodiment may include the image sensor to which the second structure is applied, the color mix problem may not be generated at all. A detailed description thereof will be described with reference to FIG. 10.

Figure 10:
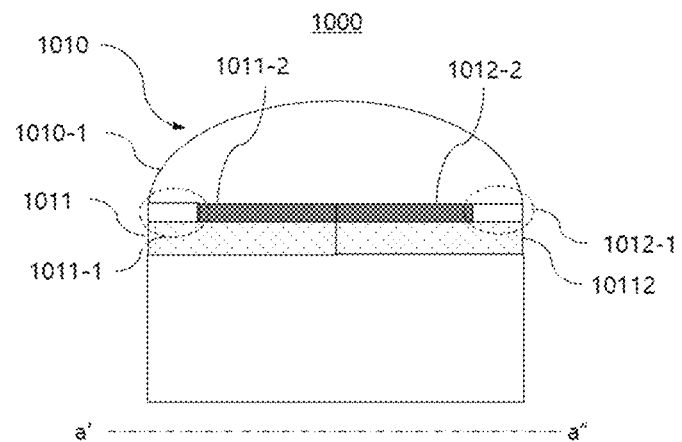
FIG. 10 is a view illustrating an image sensor of a camera system to which a second structure is applied according to an embodiment.
Figure 10:
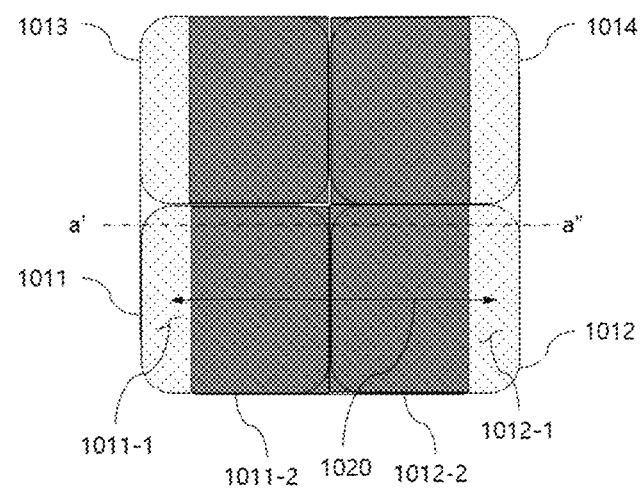

FIG. 10 is a view illustrating an image sensor of a camera system to which a second structure is applied according to an embodiment.

Referring to FIG. 10, an image sensor 1000 of a camera system to which a second structure is applied according to an embodiment is configured to include at least one pixel array 1010. This image sensor 1000 may be included in the camera system 600 described above with reference to FIG. 6, and therefore the camera system to which the second structure is applied may include a single lens and the image sensor 1000. Hereinafter, the at least one pixel array 1010 is described as including a plurality of W pixels 1011, 1012, 1013, and 1014 in a 2×2 arrangement sharing a single microlens 1010-1, but without being limited thereto, and may include a plurality of W pixels in various two-dimensional arrangements, such as a 3×3 arrangement or a 4×4 arrangement.

The at least one pixel array 1010 includes the plurality of W pixels 1011, 1012, 1013, and 1014 and the single microlens 1010-1 disposed on the plurality of W pixels 1011, 1012, 1013, and 1014 so that the plurality of W pixels 1011, 1012, 1013, and 1014 share the single microlens 1010-1. Light shielding layers 1011-2 and 1012-2 formed with OPAs 1011-1 and 1012-1 are each disposed on at least two W pixels 1011 and 1012 among the plurality of W pixels 1011, 1012, 1013, and 1014. In particular, the OPAs 1011-1 and 1012-1 are formed on the light-shielding layers 1011-2 and 1012-2, respectively, to maximize a spaced distance 1020 between the OPAs 1011-1 and 1012-1. For example, for increasing the baseline of the camera system, the OPA 1011-1 of the first W pixel 1011 and the OPA 1012-1 of the second W pixel 1012 may be formed on the light shielding layers 1011-2 and 1012-2, respectively, and may be formed a left end of the first W pixel 1011 and a right end of the second W pixel 1012 in a horizontal direction, respectively, as shown in the drawing, to maximize the spaced distance 1020 in the horizontal direction. However, without being limited thereto, when the first W pixel 1011 and the second W pixel 1012 are arranged to be adjacent to each other in the vertical direction, the OPAs 1011-1 and 1012-1 are formed on the light shielding layers 1011-2 and 1012-2, respectively, to maximize the spaced distance in the vertical direction on the first W pixel 1011 and the second W pixel 1012 unlike the drawing, or when the first W pixel 1011 and the second W pixel 1012 are arranged to be adjacent to each other in the diagonal direction, the OPAs 1011-1 and 1012-1 are formed on the light shielding layers 1011-2 and 1012-2, respectively, to maximize the spaced distance in the diagonal direction on the first W pixel 1011 and the second W pixel 1012 unlike the drawing.

Determination of the positions where the OPAs 1011-1 and 1012-1 are formed on the light shielding layers 1011-2 and 1012-2, respectively, may be performed to maximize the length of the baseline of the camera system that satisfies the limitation described above with reference to FIG. 3. For example, when the limitation that the offset f-number $$\left(F_{OA} \propto \frac{\text{pixel height}}{\text{OPA offset}}\right)$$

associated with the spaced distance 1020 between the OPAs 1011-1 and 1012-1 and the height of each of the first W pixel 1011 and the second W pixel 1012 to which the OPAs 1011-1 and 1012-1 are applied is larger than the f-number of the single lens of the camera system is satisfied, the positions where the OPAs 1011-1 and 1012-1 are formed on the light shielding layers 1011-2 and 1012-2, respectively may be determined to maximize the spaced distance 1020 between the OPAs 1011-1 and 1012-1. Here, with respect to offset f-number characteristics, when the spaced distance 1020 between the OPAs 1011-1 and 1012-1 is increased and the height of each of two W pixels 1011 and 1012 to which the OPAs 1011-1 and 1012-1 are applied is proportionally increased, the size of the offset f-number may be maintained without decreasing. Thus, the camera system according to one embodiment forms the OPAs 1011-1 and 1012-1 on the light shielding layers 1011-2 and 1012-2, respectively, to maximize the spaced distance 1020 and the height of each of the two W pixels 1011 and 1012 to which the OPAs 1011-1 and 1012-1 are applied is also increased, thereby satisfying the limitation that the offset f-number is larger than the f-number of the single lens.

In this case, the OPAs 1011-1 and 1012-1 may be formed on the light shielding layers 1011-2 and 1012-2 to have centers shifted from centers of the pixels 1011 and 1012, respectively. For example, the first OPA 1011-1 has a center shifted to the left with respect to the center of the first W pixel 1011 and the second OPA 1012-1 has the center shifted to the right with respect to the second W pixel 1012 so that the first OPA 1011-1 and the second OPA 1012-1 may have the offset centers, respectively. Thus, there is the disparity between the images obtained through the two W pixels 1011 and 1012 so that the camera system may calculate the depth for the subject based on the disparity between the images.

The at least one processor (not shown in FIG. 6) included in the camera system prevents the color mix problem from being generated at all as the camera system to which the second structure is applied does not include color pixels which receive and process color optical signals.

The foregoing devices may be realized by hardware components, software components and/or combinations thereof. For example, the devices and components illustrated in the embodiments of the inventive concept may be implemented in one or more general-use computers or special-purpose computers, such as a processor, a controller, an arithmetic logic unit (ALU), a digital signal processor, a microcomputer, a field programmable gate array (FPGA), a programmable logic unit (PLU), a microprocessor or any device which may execute instructions and respond. A processing unit may perform an operating system (OS) or one or software applications running on the OS. Further, the processing unit may access, store, manipulate, process and generate data in response to execution of software. It will be understood by those skilled in the art that although a single processing unit may be illustrated for convenience of understanding, the processing unit may include a plurality of processing components and/or a plurality of types of processing components. For example, the processing unit may include a plurality of processors or one processor and one controller. Also, the processing unit may have a different processing configuration, such as a parallel processor.

Software may include computer programs, codes, instructions or one or more combinations thereof and may configure a processing unit to operate in a desired manner or may independently or collectively control the processing unit. Software and/or data may embodied in any type of machine, components, physical equipment, virtual equipment, computer storage media or units so as to be interpreted by the processing unit or to provide instructions or data to the processing unit. Software may be dispersed throughout computer systems connected via networks and may be stored or executed in a dispersion manner. Software and data may be recorded in one or more computer-readable storage media.

The methods according to the above-described embodiments of the inventive concept may be implemented with program instructions which may be executed through various computer means and may be recorded in computer-readable media. The media may persistently store a computer-executable program or temporarily store the computer-executable program for the execution or downloading. The media may be various recording means or storage means formed by single hardware or formed the combination of several hardware. The media is not limited to media directly connected with a certain computer system, but distributed over a network. The media include magnetic media such as hard disks, floppy disks, and magnetic tape; optical media such as compact disc-read only memory (CD-ROM) disks and digital versatile discs (DVDs); magneto-optical media such as floptical disks; and hardware devices that are specially configured to store and perform program instructions, such as read-only memory (ROM), random access memory (RAM), flash memory, and the like. In addition, the media may include an App store, which distributes an application or recording/storage media managed in a site or a server which supplies or distributes software.

An embodiment provides a technique for solving the color mix which occurs in the camera system having the structure with the increased baseline to overcome the disadvantage that it is difficult to miniaturize due to the wide cross-sectional area of the stereo camera system or that a range of depth is small due to the small disparity between the images in the OA-based camera system.

In detail, an embodiment provides the camera system having one of the first structure including the reference pixel array and the second structure including the at least one pixel array including only the plurality of W pixels to solve the color mix problem which occurs in the camera system where the Offset Pixel Apertures (OPAs) are applied to pixels included in the image sensor and the spaced distance between the OPAs is maximized.

In addition, an embodiment provides the operation method of compensating the color mix in the camera system having the first structure.

While a few embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned components, such as systems, structures, devices, or circuits, are combined or coupled in different forms and modes than as described above or be substituted or switched with other components or equivalents.

Therefore, those skilled in the art can easily understand that various implementations, various embodiments, and equivalents shall be construed within the scope of the inventive concept specified in attached claims.

What is claimed is:
1. A camera system, comprising:
   a single lens; and
   an image sensor including:
   a reference pixel array including a plurality of W (white) pixels in a two-dimensional arrangement and a single microlens formed on the plurality of W pixels to be shared, and
   at least one color pixel array including two W pixels and two color pixels in a two-dimensional arrangement, and a single microlens disposed on the two W pixels and the two color pixels to be shared,
   wherein light shielding layers formed with Offset Pixel Apertures (OPAs) are disposed on the plurality of W pixels included in the reference pixel array and the two W pixels included in the at least one color pixel array, respectively, and
   wherein the OPAs are formed on the light shielding layers in the reference pixel array and the at least one color pixel array, respectively, to maximize a spaced distance between the OPAs.

2. The camera system of claim 1, further comprising:
   at least one processor configured to calculate an uncontaminated color optical signal received at the at least one color pixel array using an uncontaminated W optical signal received at the reference pixel array.

3. The camera system of claim 2, wherein the at least one processor is configured to calculate a depth for a subject using a disparity between any at least two images of any one set which is obtained through the plurality of W pixels included in the reference pixel array or is obtained through the two W pixels included in the at least one color pixel array.

4. The camera system of claim 1, wherein the OPAs are formed on the light shielding layers, respectively, in the reference pixel array and the at least one color pixel array, in a horizontal direction, in a vertical direction, or in a diagonal direction to maximize the spaced distance between the OPAs, such that a baseline of the camera system is increased.

5. The camera system of claim 1, wherein an offset f-number associated with the spaced distance between the OPAs in the reference pixel array and a height of each of the plurality of W pixels included in the reference pixel array and an offset f-number associated with the spaced distance between the OPAs in the at least one color pixel array and a height of each of the two W pixels included in the at least one color pixel array are larger than an f-number of the single lens.

6. The camera system of claim 1, wherein the two color pixels included in the at least one color pixel array process color optical signals of the same wavelength.

7. The camera system of claim 1, wherein the OPAs disposed on two W pixels of the plurality of W pixels included in the reference pixel array and the OPAs disposed on the two W pixels included in the at least one color pixel array have the same center with respect to each pixel.

8. The camera system of claim 1, wherein at least two OPAs of the OPAs disposed on the plurality of W pixels included in the reference pixel array have offset centers which are shifted with respect to each pixel, and
wherein the OPAs disposed on the two W pixel included in the at least one color pixel array have offset centers which are shifted with respect to each of the two W pixels.

9. A method of compensating color mix performed by a camera system including a single lens, an image sensor including a reference pixel array including a plurality of W (white) pixels in a two-dimensional arrangement and a single microlens formed on the plurality of W pixels to be shared, and at least one color pixel array including two W pixels and two color pixels in a two-dimensional arrangement, and a single microlens disposed on the two W pixels and the two color pixels to be shared, and at least one processor, wherein light shielding layers formed with Offset Pixel Apertures (OPAs) are disposed on the plurality of W pixels included in the reference pixel array the two W pixels included in the at least one color pixel array, respectively, and the OPAs are formed on the light shielding layers in the reference pixel array and the at least one color pixel array, respectively, to maximize a spaced distance between the OPAs, comprising:

receiving, by the plurality of w pixels included in the reference pixel array, an uncontaminated w optical signal;

receiving, by the two W pixels included m the at least one color pixel array, a contaminated W optical signal;

receiving, by the two color pixels included m the at least one color pixel array, a contaminated color optical signal from; and calculating an uncontaminated color optical signal using the uncontaminated W optical signal.

* * * * *